United States Patent [19]

Us et al.

[11] Patent Number: 4,824,803
[45] Date of Patent: Apr. 25, 1989

[54] MULTILAYER METALLIZATION METHOD FOR INTEGRATED CIRCUITS

[75] Inventors: Natasha Us, Jackson Heights; Bonggi Kim, Smithtown; John E. Berg, New York, all of N.Y.

[73] Assignee: Standard Microsystems Corporation, Hauppauge, N.Y.

[21] Appl. No.: 64,501

[22] Filed: Jun. 22, 1987

[51] Int. Cl.$^4$ ............................................. H01L 23/48
[52] U.S. Cl. .................................... 437/192; 437/189; 437/195; 437/194; 437/196; 357/67; 357/71
[58] Field of Search ............... 437/192, 189, 195, 194, 437/196; 357/67, 71

[56] References Cited

U.S. PATENT DOCUMENTS

| | | | |
|---|---|---|---|
| 4,507,852 | 4/1985 | Karulkar | 437/195 |
| 4,527,184 | 7/1985 | Fischer | 357/67 |
| 4,556,897 | 12/1985 | Yorikane et al. | 357/71 |
| 4,650,543 | 3/1987 | Kishita et al. | 437/179 |

OTHER PUBLICATIONS

Ghandhi, Sorab K., *VLSI Fabrication Principles*, John Wiley & Sons, 1983, pp. 492-497.
Chow, T. P. and A. J. Steckl, "Plasma Etching of Refractory Gates for VLSI Applications", J. Electrochemical Society: Solid-State Science and Technology, Oct. 84, pp. 2325-2335.
Ghandhi, Sorab K., *VLSI Fabrication Principles*, John Wiley & Sons, New York, 1983, pp. 502-510.

*Primary Examiner*—Brian E. Hearn
*Assistant Examiner*—Beverly A. Pawlikowski
*Attorney, Agent, or Firm*—Hopgood, Calimafde, Kalil, Blaustein & Judlowe

[57] ABSTRACT

Metal contacts and interconnections for semiconductor integrated circuits are fabricated through the deposition of a sandwich structure of metal. The bottom layer of a refractory metal prevents aluminum spiking into silicon; the top layer of refractory metal or alloy serves to reduce hillocking of the middle layer of conductive material. The upper layer of refractory metal at the location of the contact pads is etched off to improve bonding during packaging.

4 Claims, 4 Drawing Sheets

MULTILAYER METALLIZATION METHOD FOR INTEGRATED CIRCUITS

BACKGROUND OF THE INVENTION

This invention relates generally to a process for fabricating an integrated circuit, and more particularly to an improved method for fabricating metal interconnections in a semiconductor integrated circuit.

Aluminum and aluminum alloys are the most common materials used to fabricate metal contacts and interconnections in an integrated circuit built on a silicon substrate. These metals have several advantages over other conductive materials, most importantly, because of their low resistivity which results in an increase in device operating speed. In addition, these metals are relatively soft and flexible and, therefore, bond well to underlying layers and tend not to lift off. Aluminum is also a relatively inexpensive material.

However, the use of aluminum is not without its drawbacks. For example, aluminum spiking into the substrate may occur. Moreover, hillocking on the aluminum layer can be induced by thermal cycling during various processes, such as a high-temperature anneal step after the aluminum is deposited. This leads to reduced reliability and greater processing difficulties. In double level metal processes, for example, large hillocks can cause shorts between aluminum layers. Hillocks may also cause difficulties in photolithographic definition of fine lines due to irregular reflections.

It is known that the use of a refractory metal as the top layer of the metallization layer will reduce the likelihood of hillock formation on an aluminum layer. However, this can result in difficulties during final packaging, as refractory metals are brittle and are not easily processed at low temperatures, and therefore do not bond easily to gold or aluminum bonding wires. As a result, it is necessary to remove the upper refractory metal at the location of the bonding pads. This has, however, in the past required the performance of an additional photolithographic step or the formation of an additional metal layer of aluminum over the upper refractory metal layer.

It is an object of the present invention to provide a metallization process which allows contact to be made to the bonding pads during the fabrication of a semiconductor integrated circuit without the requirement of an additional photolithographic operation.

It is a further object of the present invention to provide an improved metallization process of the type described, which reduces significantly the formation of hillocks in the metal contacts and interconnections and substantially eliminates aluminum spiking.

SUMMARY OF THE INVENTION

To these ends, the invention provides a process for depositing and etching metal contacts and interconnections in a semiconductor integrated circuit. The metal is deposited as a sandwich structure consisting of a refractory metal, aluminum or aluminum alloy, and a refractory metal. This configuration of the metallization layer minimizes hillocking and eliminates aluminum spiking. The metal is etched anisotropically in a reactive ion etch as described, for example, in U.S. Pat. No. 4,650,543. After an overlay oxide and/or nitride is deposited over the sandwich metallization structure and etched at the locations of the bonding pads, the top layer of refractory metal exposed at the bonding pads is etched off in a plasma etcher without the need for an additional photolithographic operation, so as to improve the adhesion of gold or aluminum wires to the bonding pads during packaging of the integrated circuit.

BRIEF DESCRIPTION OF THE DRAWINGS

To the accomplishment of the above and such further objects as may hereinafter appear, the present invention relates to a process for forming a metallization pattern in an integrated circuit substantially as defined in the appended claims and as described in the following detailed specification, as considered in conjunction with the accompanying drawings in which:

DETAILED DESCRIPTION OF THE INVENTION

In the exemplary embodiment of the invention illustrated in the figures, the process of the invention is described in connection with the fabrication of a CMOS device. It will be understood, however, that the process of the invention may also be used to comparable advantage in the fabrication of NMOS and PMOS devices.

Figure 1A:
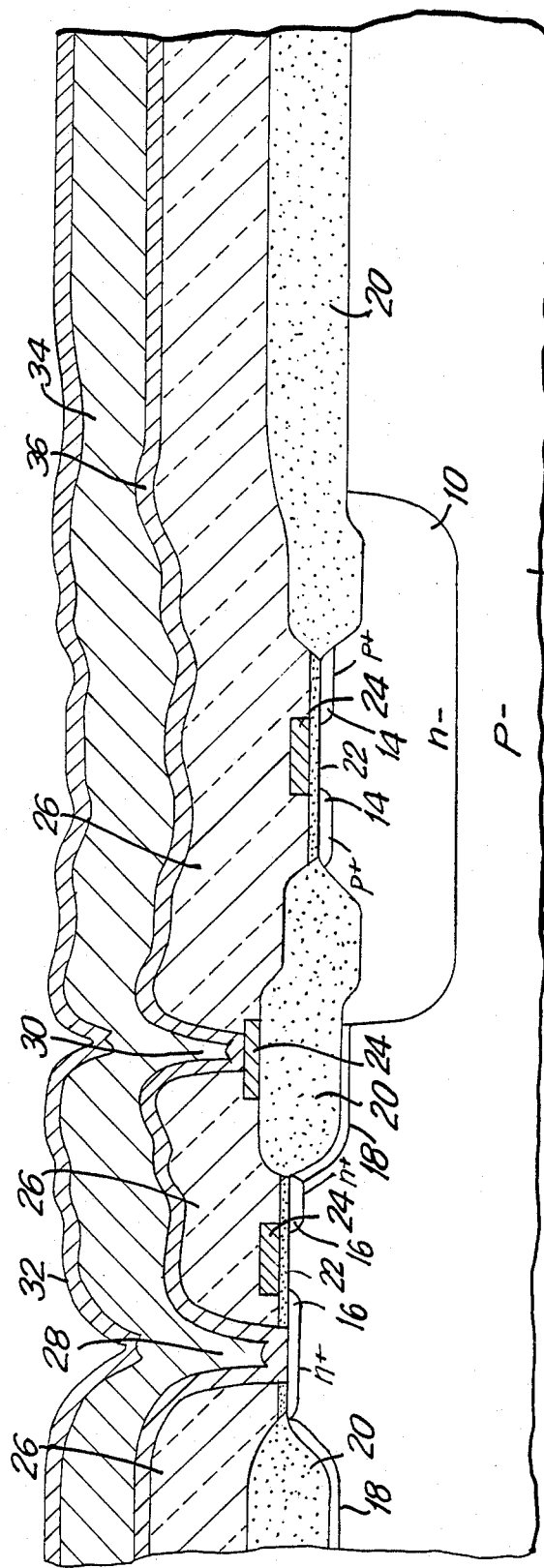
FIGS. 1a–1e are cross sections of a semiconductor integrated circuit fabricated in accordance with the present invention shown in various stages in the fabrication process, leading up to the final structure illustrated in FIG. 1e.

Referring first to FIG. 1a, an n-well 10 is formed in any known manner in the upper surface of a substrate 12 here shown as being of p+ conductivity. CMOS transistors are formed in the silicon wafer by doping with boron or boron difluoride ions to form p+ regions 14 in the n-well 10 and by doping with arsenic or phosphorus ions to form n+ regions 16 in the p-type substrate 12. As is also conventional, a p+ field implant 18 is performed, a field oxide layer 20 and a gate oxide 22 are grown, and polysilicon regions 24 are deposited and preferentially etched to form the gate regions of the MOS transistors and other conductive areas. A glass layer 26 is deposited over this structure and contact openings 28 and 30 are selectively etched in the glass layer.

A multilayer metallization layer is then deposited over this structure. As shown in FIG. 1a, the metallization structure consists of a 200–2000 Å layer of titanium 32 over an approximately 1.0 micron layer 34 of aluminum - 1% silicon. Underlying the aluminum layer 34 is a 1200–2000 Å layer of titanium 36. Other refractory metals besides titanium and their alloys and aluminum alloys may also be used in the metallization sandwich structure. The initial or underlying layer 32 of refractory metal or refractory metal alloys prevents aluminum spiking into the silicon substrate. The upper refractory metal layer 36 suppresses the formation of hillocks in the intermediate aluminum or aluminum alloy layer 34, which is undesirable in single metal processes because of reduced reliability and greater processing difficulties, and is additionally undesirable in double metal processes because of the risk of shorts between two aluminum layers.

Figure 1B:
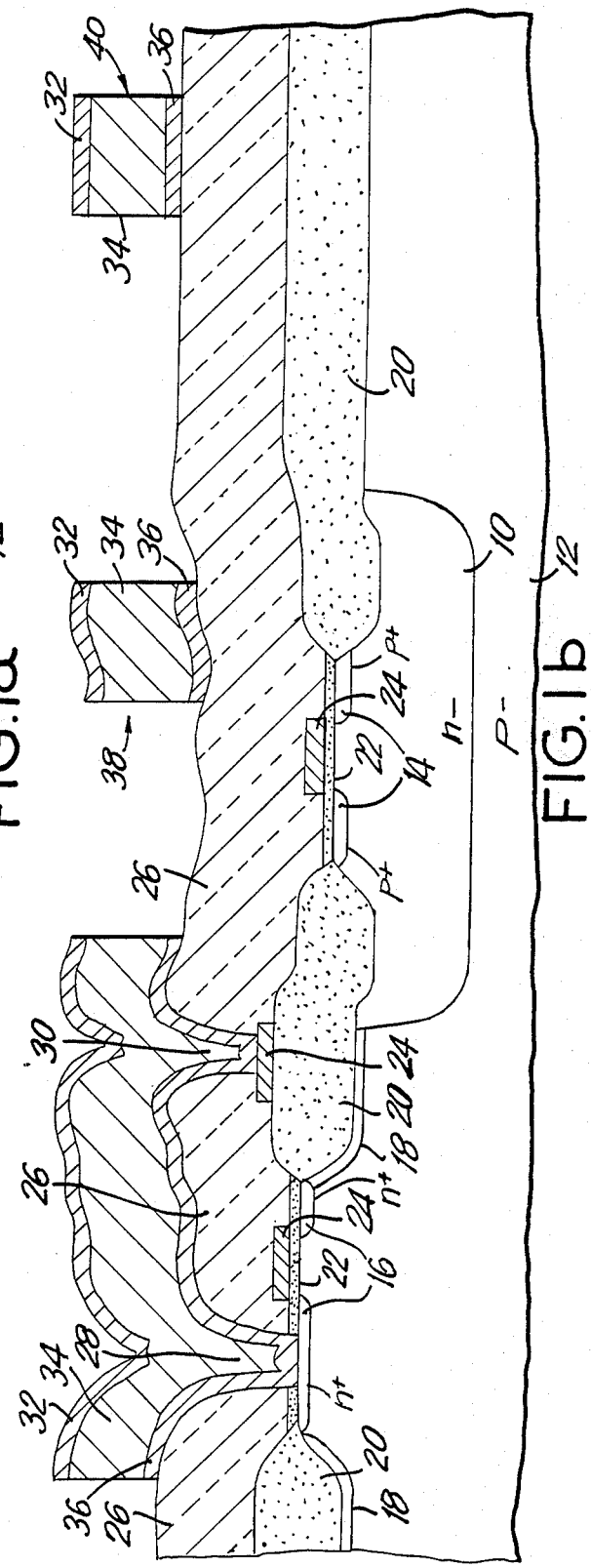

Thereafter, as shown in FIG. 1b, a photoresist is patterned and the metal layers 32, 34 and 36 are etched to create the metal pattern illustrated in FIG. 1b to define the location of an interconnect 38 and a bonding pad 40. The etch used in this step is preferably an anisotropic reactive ion etch employing chlorine-based chemistry so that the metal is mostly removed vertically, and slightly horizontally.

Figure 1C:
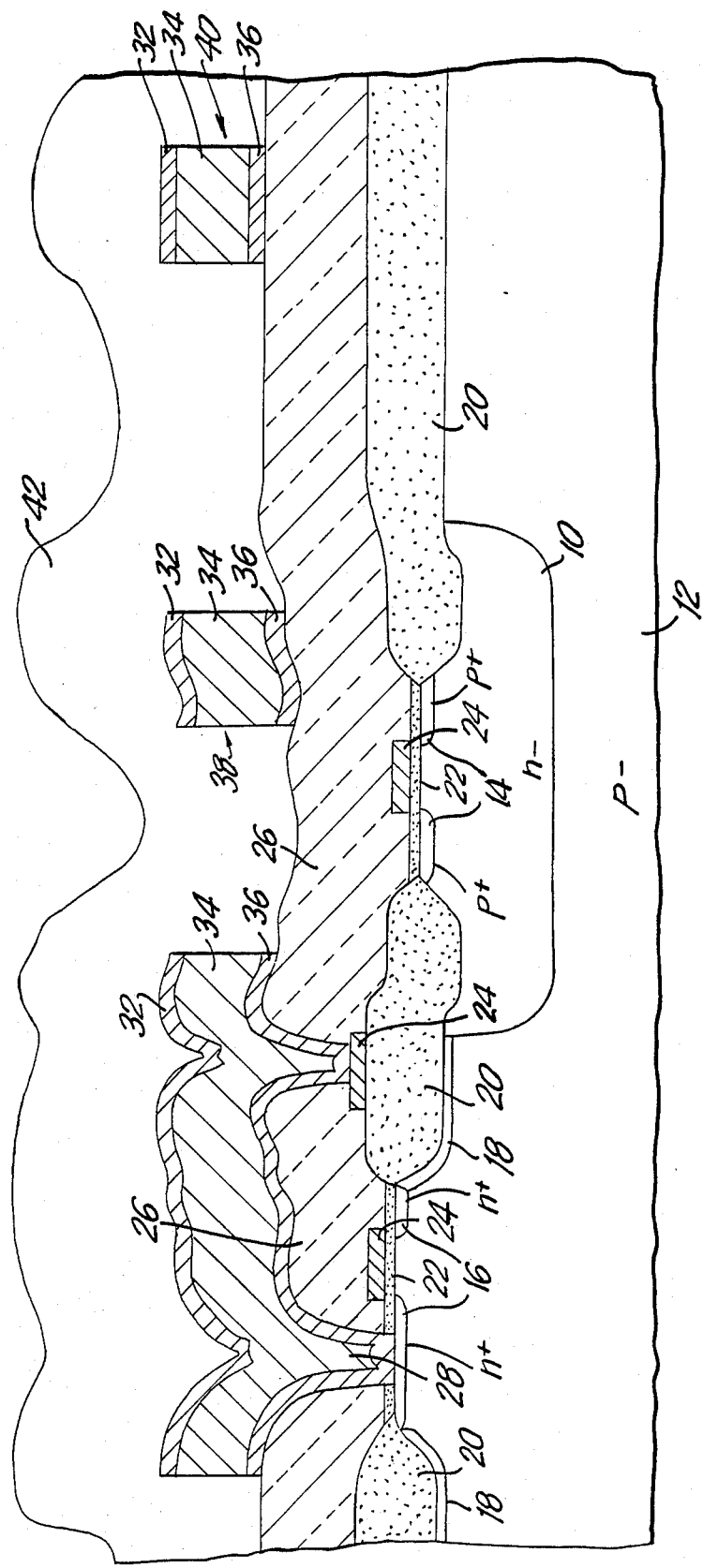
Figure 1D:
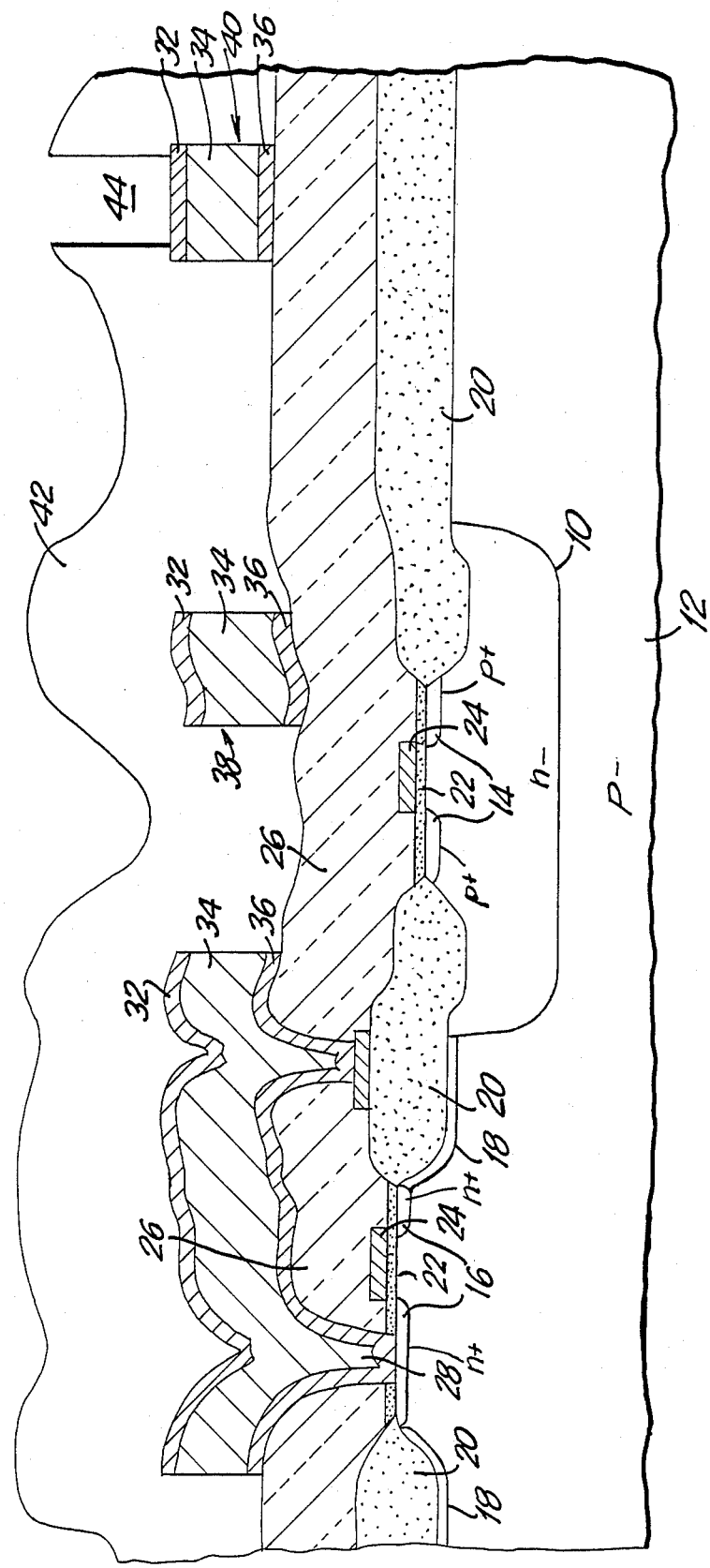

If the MOS device is to employ a single metal layer, an overlay oxide and/or nitride layer 42 is deposited in a PECVD system, as illustrated in FIG. 1c. Layer 42, which may be approximately 8000 Å thick, serves as a passivation layer for the device. An anisotropic, vertical orientation-dependent reactive ion etch which utilizes fluorine-based chemistry is then used to create an opening 44 in layer 42 to the bonding pad 40 as shown in FIG. 1d.

Figure 1E:
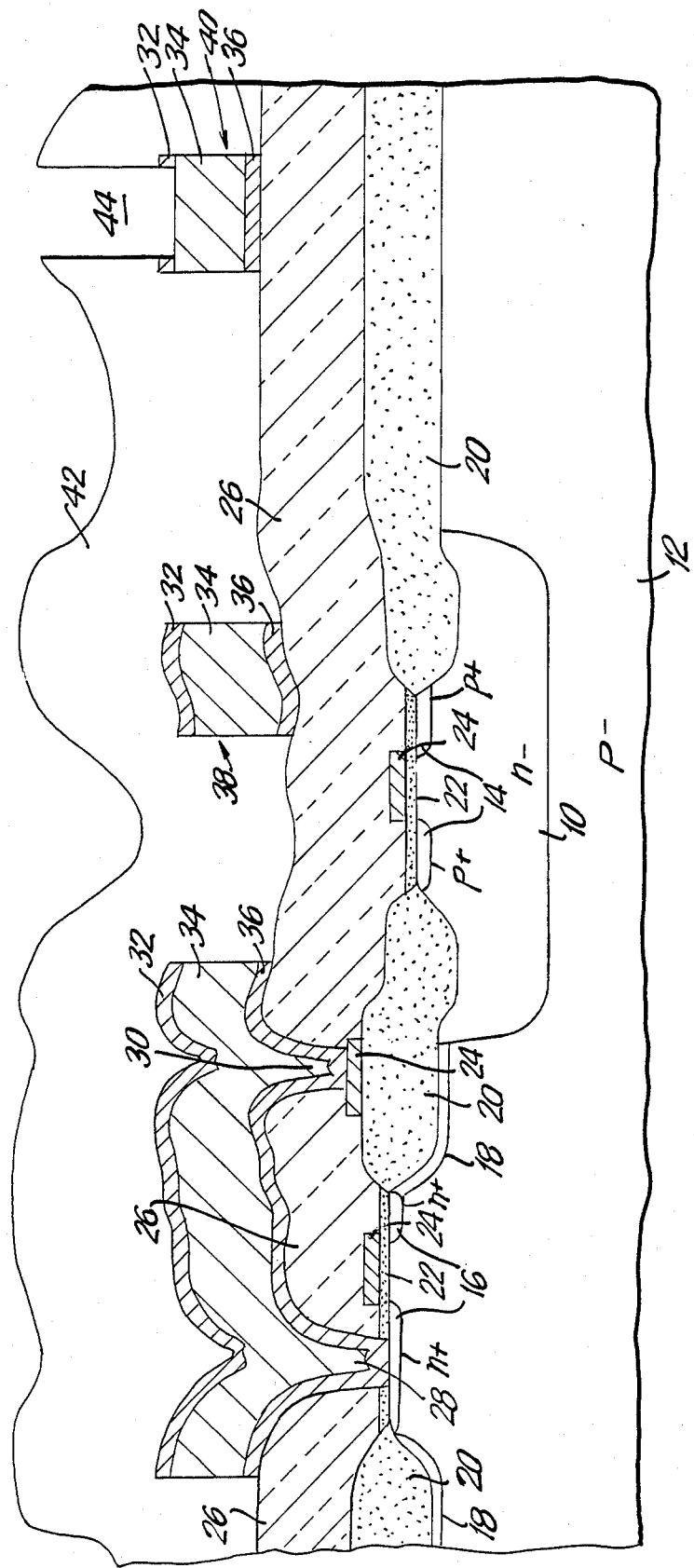

Finally, to improve the adhesion of gold or aluminum bonding wires to the bonding pad, the upper refractory titanium metal layer 32 on top of the bonding pad is removed to allow gold or aluminum bonding wires to be bonded to the exposed aluminum layer 34. The removal of the upper titanium layer is preferably achieved through the use of a dry etch employing fluorine-based chemistry, at a power of between 900 and 1500 watts, a pressure of between 80 and 125 mTorr, and a flow rate of $SF_6$ of between 80 and 120 sccm. The removal of the overlying titanium layer 32 in this manner, which is accomplished without the need for any additional photolithographic step, results in the structure illustrated in FIG. 1e.

Although this invention has been described with regard to a specific embodiment for illustrative purposes, this description is not meant to be limiting. For example, it will be apparent to those skilled in the art that the process of this invention may be used with other integrated circuit fabrication techniques. It is also believed apparent that modifications to the inventive process described hereinabove may be made by those skilled in the art without necessarily departing from the spirit and scope of the invention.

What is claimed is:

1. A method of making a metal connection to the face of a semiconductor body, the connection extending over a step in an insulating layer on the face, said method comprising:
    (a) providing a substrate;
    (b) forming a three-layer sandwich structure of metal by depositing a layer of a refractory metal, a layer of aluminum or aluminum alloy, and a layer of refractory metal over said substrate;
    (c) selectively removing said three-layer sandwich structure;
    (d) depositing a protective oxide and/or nitride overlay layer over the remaining portions of said three-layer metal sandwich structure;
    (e) etching an opening to the bonding pad in said protective overlay layer; and
    (f) employing the remaining overlay layer as an etchant mask, and without using an additional lithography step, selectively removing by dry etching the refractory metal layer at the bonding pad to expose the underlying aluminum or aluminum alloy.

2. The method according to claim 1, wherein the refractory material is titanium or titanium-tungsten alloy.

3. The method according to claim 2, wherein said step of selectively removing said three-layer metal structure includes vertical anisotropic dry etching employing chlorine- and fluorine-based chemistries.

4. The method according to claim 3, in which said upper refractory metal removing step includes the use of a dry etch employing fluorine-based chemistry.

* * * * *